United States Patent [19]

Hayes, Jr.

[11] Patent Number: 5,788,514

[45] Date of Patent: Aug. 4, 1998

[54] DEVICE FOR CONNECTING ELECTRICAL COMPONENTS HAVING WIRE LEADS

[75] Inventor: John Joseph Hayes, Jr., Wake Forest, N.C.

[73] Assignee: Ericsson Inc., Stockholm, Sweden

[21] Appl. No.: 675,035

[22] Filed: Jul. 3, 1996

[51] Int. Cl.$^6$ .................................................. H01R 9/09
[52] U.S. Cl. ............................................................ 439/76.1
[58] Field of Search ............................. 439/76.1, 66, 86, 439/91, 607, 581

[56] References Cited

U.S. PATENT DOCUMENTS

| | | | |
|---|---|---|---|
| 3,912,354 | 10/1975 | Champbell et al. | 439/607 X |
| 4,932,873 | 6/1990 | La Shier | 439/76.1 |
| 5,251,092 | 10/1993 | Brady et al. | 439/76.1 X |
| 5,336,113 | 8/1994 | Chanteau | 439/581 OR |

Primary Examiner—Neil Abrams
Assistant Examiner—Daniel Wittels
Attorney, Agent, or Firm—Burns, Doane, Swecker & Mathis, LLP

[57] ABSTRACT

A method and device for connecting an electrical component having a lead wire to a printed circuit board or other component in an electrical device includes supporting element for the electrical component having a press fit or frictional device to hold the lead wire in a fixed position, and an intermediate device having a hole for holding an electrically conductive elastomeric connector in a fixed position. The printed circuit board is assembled adjacent one side of the intermediate device and the supporting element is assembled on the other side of the intermediate device so that the connector is pressed into contact with the printed circuit board and the lead wire.

9 Claims, 1 Drawing Sheet

DEVICE FOR CONNECTING ELECTRICAL COMPONENTS HAVING WIRE LEADS

FIELD OF THE INVENTION

The invention is directed to electrical devices having components with wire leads that are connected to other components in the device, including printed circuit boards. More particularly, the invention is directed to a device and method for connecting wire lead components in electronic devices that eliminates the need to specially prepare the leads or use soldered connectors on the leads.

BACKGROUND

In the manufacture of electrical devices, it is often necessary to connect electrical components with lead wires to other components in the device, for example, a printed circuit board. In a cellular telephone, standard speakers and microphones have lead wires which must be connected to a printed circuit board. Conventionally, electrical connectors are soldered to the wires and mating connectors attached to the printed circuit board. During assembly, the respective connectors are attached in an additional step. Alternatively, the wires are soldered directly to the printed circuit board. In these known methods, both parts and manufacturing steps are required, which adds cost and time expense to the telephone assembly.

SUMMARY OF THE INVENTION

The invention provides a low cost method and device for attaching an electrical component having a lead wire to another component during assembly of an electrical device that eliminates the expensive connectors and manufacturing steps of the art.

According to the invention, an electrical connection is formed at the lead wire with a resilient compressible electrically conductive material formed as a connector. The connector is captured on a supporting element of the electrical device so that during assembly of the device, the connector becomes disposed between and in electrically conducting contact with both the lead wire of the component and a contact of the other component.

According to another aspect of the invention, a first supporting element of the electrical device, for example, a front cover, includes means for holding the lead wire in a fixed position. For ease of manufacturing, the holding means is a press fit or frictional holding device, for example, a clamp having resilient fingers between which the wire may be captured.

According to the invention, the connector is formed of an elastomeric material with an electrically conductive material filler. The connector is cylindrically or disk shaped, and is disposed in a second element that is to be assembled adjacent the first supporting element. In a cellular telephone, for example, the second element may comprise a light guide having a hole for the connector. Once inserted in the hole, the connector projects from the opposite surfaces of the light guide.

Alternatively, the first supporting element may include a holding means to capture the connector and hold it in contact with the lead wire.

According to a method of the invention, the electrical component is mounted on the first supporting element and the lead wire is captured in the holding device. An elastomeric connector is disposed in a hole in the second supporting element. The second supporting element is positioned adjacent the first element so that the elastomeric connector is in contact with the lead wire. The printed circuit board is positioned adjacent the second supporting element and the electrical device is assembled to hold the printed circuit board, second supporting element and first supporting element together so that the elastomeric connector is pressed into contact simultaneously with the lead wire and the printed circuit board.

BRIEF DESCRIPTION OF THE DRAWING FIGURES

The invention will be better understood through the following description in conjunction with the appended drawings, in which.

DETAILED DESCRIPTION

The invention is described below in conjunction with a cellular telephone, in which the invention may be advantageously used. The components and devices described as forming an environment for the invention are not meant to be limiting, but rather illustrative of a way of using the invention. Those skilled in the art will understand that the invention may be used in a variety of other electrical devices.

Figure 1:
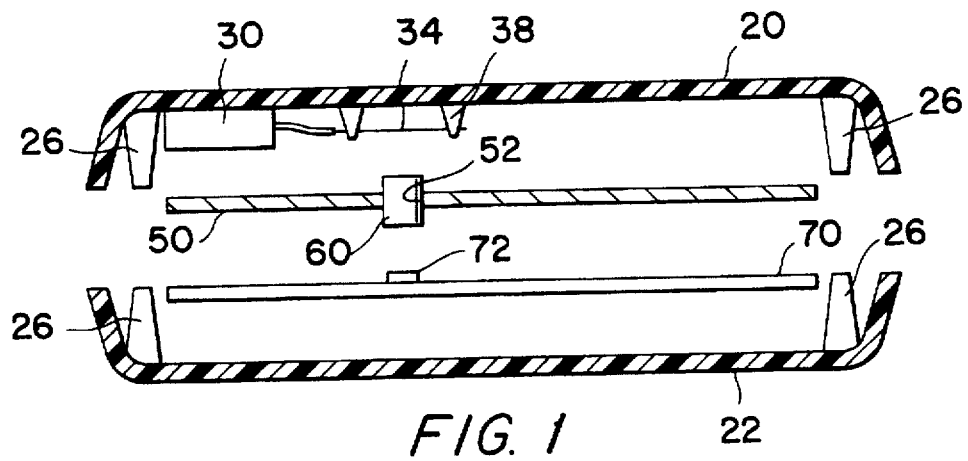
FIG. 1 is a sectional, exploded view of an electrical device illustrating a connecting device according to the invention.

As seen in FIG. 1, a front cover 20 and rear cover 22 of a cellular telephone are formed as shell-like elements that fit together to define an interior space to contain the electrical components of the telephone. The front cover 20 and rear cover 22 may include mating bosses 26 projecting toward an inner side of each. Threaded fasteners extending through the bosses 26 are used to fasten the covers together. Other means for fastening the front and rear covers may be used as is known. The illustration of the figures is greatly simplified and is not to scale.

Figure 2:
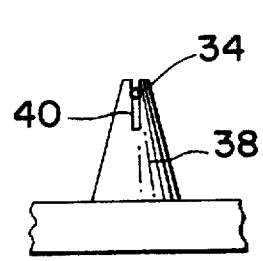
FIG. 2 is a side view of lead wire capturing device.

The front cover 20 provides a supporting element for an electrical component 30 having a lead wire, for example, a speaker. The speaker 30 may be easily fastened to the front cover 20 with adhesive, for example, or other suitable means. At least one lead wire 34 extends from the speaker 30 and an end part is stripped of insulation. The lead wire 34 is captured in a device 38 that holds the lead wire in a fixed position on the front cover 20. According to a preferred embodiment, the lead wire 34 is simply inserted by press fit or frictional engagement into the holding device 38. The holding device 38 is advantageously formed during the molding of the front cover 20 as a stud having a slot 40 to frictionally hold the wire, as illustrated in the side view of the device 38 in FIG. 2. Alternatively, a clamp or clip arrangement may be used. With such a holding device 38, the lead wire 34 may be inserted in the device 38 during the same manufacturing step by which the speaker 30 is placed on the front cover 20.

A resilient, compressible electrical connector 60 is disposed in the device for contact with the lead wire 34 and the other component upon assembly of the electrical device. By using a compressible connector, the spacing tolerances of the assembly are easily accommodated. In addition, a resilient, compressible connector is easily captured and supported in the electrical device, as described below.

The resilient, compressible electrical connector 60 in accordance with the invention is advantageously formed of an elastomeric material having a filler of electrically conductive material, which is readily available. Alternatively, any resilient, compressible material having electrical conductive properties may be used. The connector 60 illustrated in FIG. 1 is cylindrical or disk shaped, which is convenient for the structures in a cellular telephone, more fully described below. The connector 60 may alternatively have any shape convenient for the supporting structure and interior space available in the electrical device.

Figure 3:
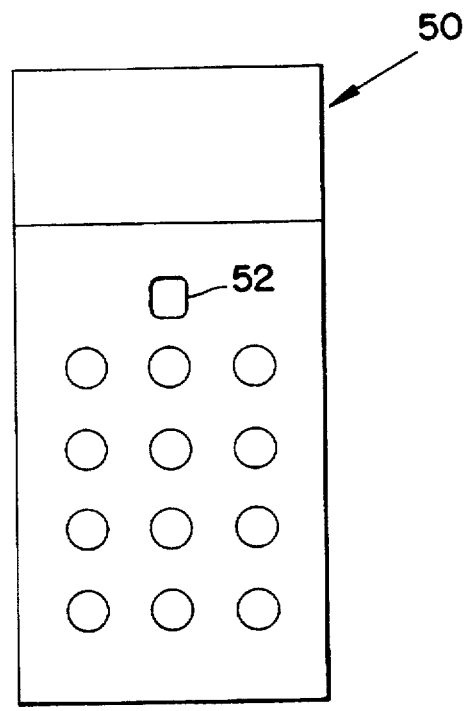
FIG. 3 is a top view of a light guide having a mounting hole for an electrical connector; and, FIG. 4 is a top view of an alternative lead wire capturing device.

In a cellular telephone, a light guide 50 advantageously provides a means for capturing and supporting the connector 60. A light guide 50 is typically disposed adjacent the front cover 20. Light guides are planar elements used to distribute light to illuminate the display screen and the buttons of a cellular telephone. As shown in FIGS. 1 and 3, a light guide 50 in accordance with the invention includes a hole 52 for the electrical connector 60. The connector 60 is inserted in the hole 52 and projects from the opposing surfaces of the light guide 50.

When the light guide 50 is positioned adjacent the front cover 20, the connector 60 is positioned in contact with the lead wire 34.

In cellular telephones and other miniaturized electronic device, a lead wire component such as a speaker is connected to a printed circuit board, which typically carries many of the electronic components and circuitry. The electrical device may alternatively include a flex board, or other supporting structure for electronic components to which a component is connected. The printed circuit board 70 illustrated in FIG. 1 includes a terminal 72 which is to be connected to the lead wire 34. As may be understood through FIG. 1, by positioning the light guide 50 holding the connector 60 between the front cover 20 and the printed circuit board 70, the connector is pressed into contact with the lead wire 34 and the terminal 72 on the printed circuit board 70 to make the electrical connection.

Assembly of the telephone includes fastening the rear cover 22 to the front cover 20, which supports the light guide 50 and printed circuit board 70 in adjacent position so that the connector 60 contacts the lead wire 34 and the printed circuit board 70.

Figure 4:
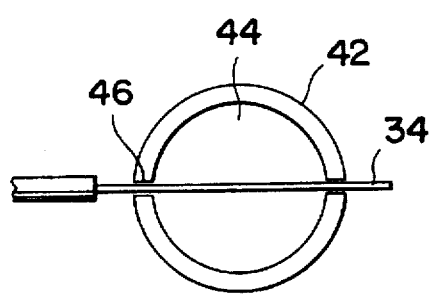

Alternatively, illustrated in FIG. 4, a wire holding device 42 on the front cover 20 may be formed to hold the connector 60 in contact with the lead wire 34. The wire holding device 42 is shaped as a stand up collar defining an opening 44 into which the connector 60 is pressed and having a slot 46 for the lead wire 34. After the lead wire 34 is inserted in the slot 46, the connector 60 is pressed into the hole 44 into contact with the lead wire. A hole is provided in the light guide 50, or other component that may be disposed between the front cover and the printed circuit board 70 to allow the connector 60 to contact the terminal 72.

According to another aspect of the invention, the component 30 may be connected to a second component having a wire lead. The second component and lead wire may be mounted on a second supporting element in the same manner as described above for the speaker 30. The connector 60 may be captured in a light guide or in a device 42 formed as part of the wire lead holding device of either of the first or second supporting elements. The first and second supporting elements may then positioned so that the connector contacts both of the captured lead wires to form the electrical connection.

The method according to the invention, as may be understood from the above description, includes the steps of mounting an electrical component having at least one lead wire on a first supporting element, capturing the at least one lead wire in a holding device mounted on the first supporting element to hold the lead wire in a fixed position on the supporting element, capturing a resilient, compressible electrically conductive connector in a holding device on a second supporting element to hold the connector in a fixed position on the second supporting element, positioning the second support element relative to the first support element so that the connector is in contact with the lead wire, and positioning a printed circuit board relative to the second support element so that the connector is pressed into contact with a predetermined portion of the printed circuit board, wherein, electrical contact between the electrical component and the printed circuit board is formed.

The invention has been described in terms of preferred embodiments and principles, but is not meant to be limited thereto. Those skilled in the art will understand that the invention may be practiced with equivalents and substitutions without departing from the scope of the invention as defined in the following claims.

What is claimed is:

1. A device for electrically connecting a component having at least one wire lead with a second component in an electrical device, comprising:

a supporting element having wire capturing means to hold a lead wire of a first component in a fixed position;

an electrically conductive, resilient compressible connector;

means for supporting the connector in a predetermined position;

means for supporting a second component; and means for assembling the supporting element, said means for supporting the connector and said means for supporting the second component so that the connector simultaneously contacts the lead wire and electrical contact means of the second component.

2. The device according to claim 1, wherein the electrically conductive resilient compressible connector is a plug formed of an elastomeric material having a electrically conductive material filler.

3. The device according to claim 1, wherein the second component is a printed circuit board having a contact to connect to the lead wire.

4. The device according to claim 1, wherein the wire capturing means is a stud formed on the supporting element and having a slot for receiving the lead wire.

5. The device according to claim 1, wherein said means for supporting the electrically conductive connector is a second support element having a hole in a predetermined location in which the connector is insertable.

6. The device according to claim 1, wherein said means for supporting the electrically conductive connector comprises a collar defining an interior space and having a slot to receive the lead wire formed on the supporting element.

7. The device according to claim 1, wherein the device includes a front cover and a rear cover, the supporting element for the electrical component being the front cover of the device.

8. The device according to claim 7, wherein the second component is a printed circuit board, and wherein the rear cover includes mounting means for the printed circuit board, and said assembly means comprises fasteners for fastening the front cover to the rear cover.

9. The device according to claim 1, wherein the second component includes a lead wire to be connected to the lead wire of the first component, and wherein the device further comprises a second supporting element having wire capturing means to hold a lead wire of a second component in a fixed position.

* * * * *